United States Patent
Stodolny et al.

(10) Patent No.: US 11,038,069 B2
(45) Date of Patent: Jun. 15, 2021

(54) PHOTOVOLTAIC CELL WITH PASSIVATING CONTACT

(71) Applicant: Nederlandse Organisatie voor toegepast-natuurwetenschappelijk Onderzoek TNO, 's-Gravenhage (NL)

(72) Inventors: Maciej Krzyszto Stodolny, 's-Gravenhage (NL); Lambert Johan Geerligs, 's-Gravenhage (NL); Evert Eugène Bende, 's-Gravenhage (NL); John Anker, 's-Gravenhage (NL)

(73) Assignee: Nederlandse Organisatie voor toegepast-natuurwetenschappeliik Onderzoek TNO, 's-Gravenhage (NL)

( * ) Notice: Subject to any disclaimer, the term of this patent is extended or adjusted under 35 U.S.C. 154(b) by 106 days.

(21) Appl. No.: 16/464,281

(22) PCT Filed: Nov. 24, 2017

(86) PCT No.: PCT/NL2017/050771
§ 371 (c)(1),
(2) Date: May 27, 2019

(87) PCT Pub. No.: WO2018/097722
PCT Pub. Date: May 31, 2018

(65) Prior Publication Data
US 2020/0287066 A1  Sep. 10, 2020

(30) Foreign Application Priority Data
Nov. 25, 2016 (NL) ..................... 2017872

(51) Int. Cl.
*H01L 31/0224* (2006.01)
*H01L 31/048* (2014.01)
*H01L 31/0368* (2006.01)

(52) U.S. Cl.
CPC ........... *H01L 31/022433* (2013.01); *H01L 31/022441* (2013.01); *H01L 31/048* (2013.01); *H01L 31/03682* (2013.01)

(58) Field of Classification Search
None
See application file for complete search history.

(56) References Cited

U.S. PATENT DOCUMENTS

| 9,130,074 B2 | 9/2015 | Schultz-Wittmann |
| 2010/0000597 A1 | 1/2010 | Cousins |

(Continued)

FOREIGN PATENT DOCUMENTS

| KR | 20160137595 A | * 11/2016 | ......... H01L 31/0745 |
| WO | WO-2015130672 A1 | * 9/2015 | ........... H01L 31/068 |

OTHER PUBLICATIONS

Rienacker Michael et al: "Recombination Behavior of Photolithography-free Back Junction Back Contact Solar Cells with Carrier-selective Polysilicon on Oxide Junctions for Both Polarities", Energy Procedia, Elsevier, NL, vol. 92, Sep. 23, 2016.

(Continued)

*Primary Examiner* — Andres Munoz
(74) *Attorney, Agent, or Firm* — N.V. Nederlandsch Octrooibureau; Catherine A. Shultz; Katelyn J. Bernier

(57) ABSTRACT

A semiconductor substrate (1) having an active region (2) and a first surface and a second surface facing each other. A first type of passivating layer (5) is present for providing an electrical contact of a first conductivity type on a part of the first surface of the semiconductor substrate (1). A dielectric layer (4) is provided between the first type of passivating layer (5) and an active region (2) of the semiconductor substrate (1). Doping of the first conductivity type is provided in a layer (3) of the active region (2) of the semiconductor substrate (1) near the first surface. The lateral dopant (Continued)

Figure 1A:
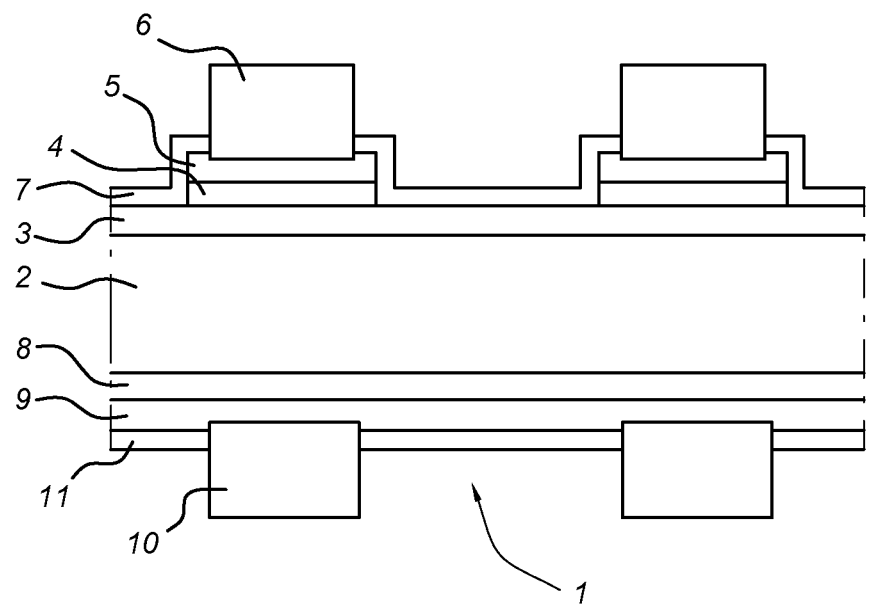

level in the layer (3) of the active region (2) near the first surface is substantially uniform.

9 Claims, 4 Drawing Sheets

(56) References Cited

U.S. PATENT DOCUMENTS

2014/0166095 A1 6/2014 Loscutoff et al.
2014/0311567 A1* 10/2014 Choi .................... H01L 31/072
136/258

OTHER PUBLICATIONS

Udo Romer et al: "Ion Implantation for Poly-Si Passivated Back-Junction Back-Contacted Solar Cells", IEEE Journal of Photovoltaics, vol. 5, No. 2, Mar. 1, 2015.
Tao Yuguo et al: "Carrier selective tunnel oxide passivated contact enabling 21.4% efficient large-area N-type silicon solar cells", 2016 IEEE 43rd Photovoltaic Specialists Conference (PVSC), IEEE, Jun. 5, 2016.

* cited by examiner

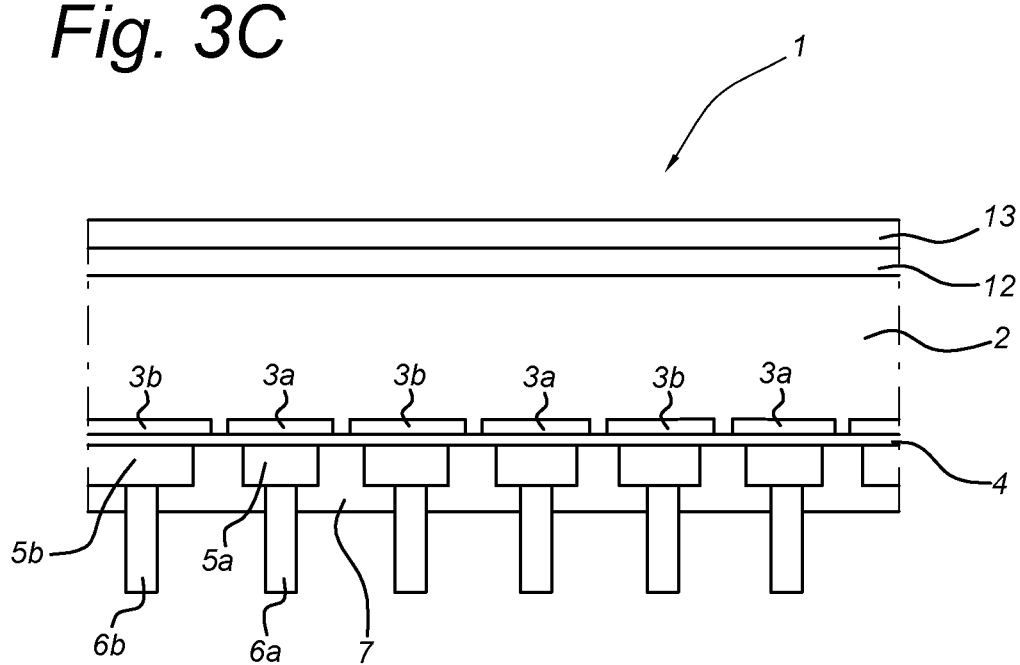
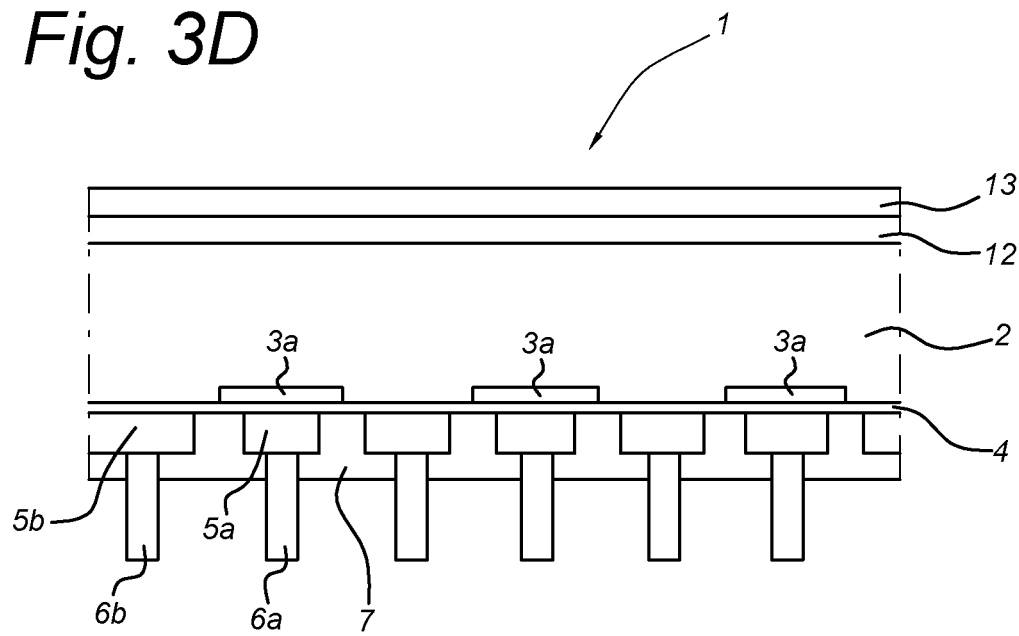

PHOTOVOLTAIC CELL WITH PASSIVATING CONTACT

FIELD OF THE INVENTION

The present invention relates to a semiconductor substrate having an active region and a first surface and a second surface facing each other.

BACKGROUND ART

American patent publication U.S. Pat. No. 9,130,074 discloses a structure and manufacturing method of a solar cell, with (generic) a substrate, conductive layer(s), antireflection layer(s), passivation layer(s) and electrode(s). Some of the layers of the solar cell are multifunctional and combine passivation, transparency and sufficient conductivity for vertical carrier flow. In one of the embodiments disclosed, directly under a front electrode area an electrically passivating conductive film is present (e.g. n-type polycrystalline silicon), under which an electrically passivating interface layer is provided (e.g. a thin silicon oxide layer) on top of the substrate material. In the areas between the front electrodes a stack of layers is present on the substrate comprising a phosphorus diffused silicon layer, an electrically passivating layer (e.g. silicon oxide), and an antireflection layer.

American patent publication US 2014/0166095 discloses an all back contact solar cell having a hybrid emitter design. The solar cell has a thin dielectric layer formed on a backside surface of a single crystalline silicon substrate. One emitter of the solar cell is made of doped polycrystalline silicon (e.g. P-polarity) that is formed on patterned thin dielectric layer. The other emitter of the solar cell is formed in the single crystalline silicon substrate and is made of doped single crystalline silicon (e.g. N-polarity).

American patent publication US 2010/0000597 discloses a bipolar solar cell including a backside junction formed by a silicon substrate and a first doped layer of a first dopant type on the backside of the solar cell. A second doped layer of a second dopant type makes an electrical connection to the substrate from the front side of the solar cell. A first metal contact of a first electrical polarity electrically connects to the first doped layer on the backside of the solar cell, and a second metal contact of a second electrical polarity electrically connects to the second doped layer on the front side of the solar cell.

SUMMARY OF THE INVENTION

The present invention seeks to provide an improved structure for application in a more efficient photovoltaic cell.

According to the present invention, a semiconductor substrate as defined above is provided, comprising a first type of passivating layer for providing an electrical contact of a first conductivity type on a part of the first surface of the semiconductor substrate, wherein a dielectric layer is provided between the first type of passivating layer and an active region of the semiconductor substrate, and wherein doping of the first conductivity type is provided in a layer of the active region of the semiconductor substrate near the first surface, aligned with the first type of passivating layer, and wherein the lateral dopant level in the layer of the active region near the first surface is substantially uniform. The invention embodiments allow to provide photovoltaic cells having improved efficiency. The layer of the active region with such a doping underneath the electrode related area will improve lateral conductivity for electron/hole transport locally, improve the series resistance, in all further improving the efficiency of a resulting photovoltaic cell. Invention embodiments are also included and described herein which are suitable for bi-facial photovoltaic cells, as well as interdigitated back contact (IBC) cells.

SHORT DESCRIPTION OF DRAWINGS

Figure 1B:
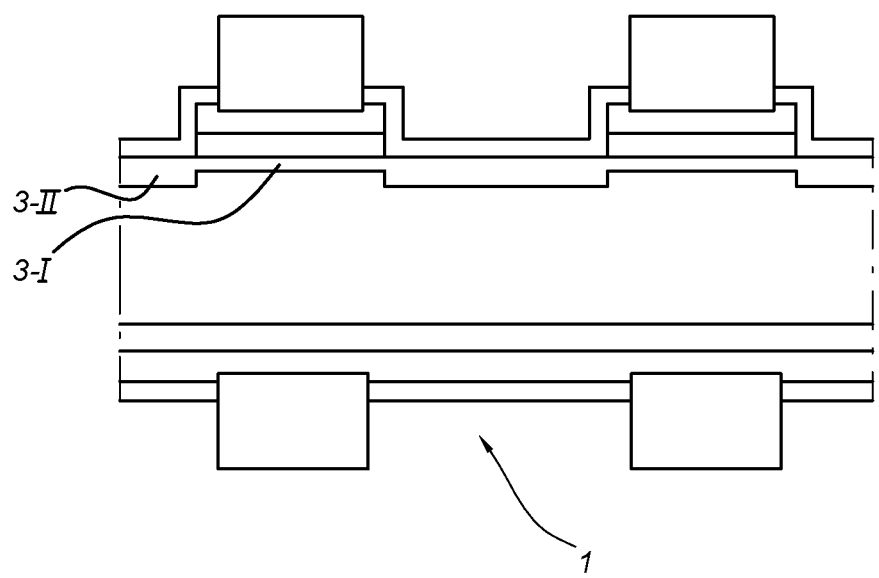
Figure 2A:
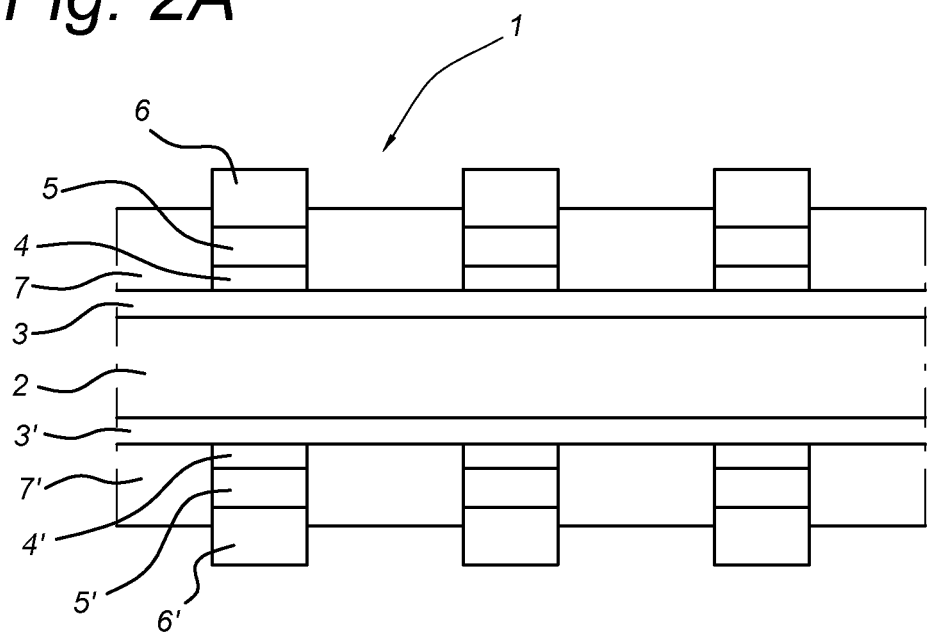
Figure 2B:
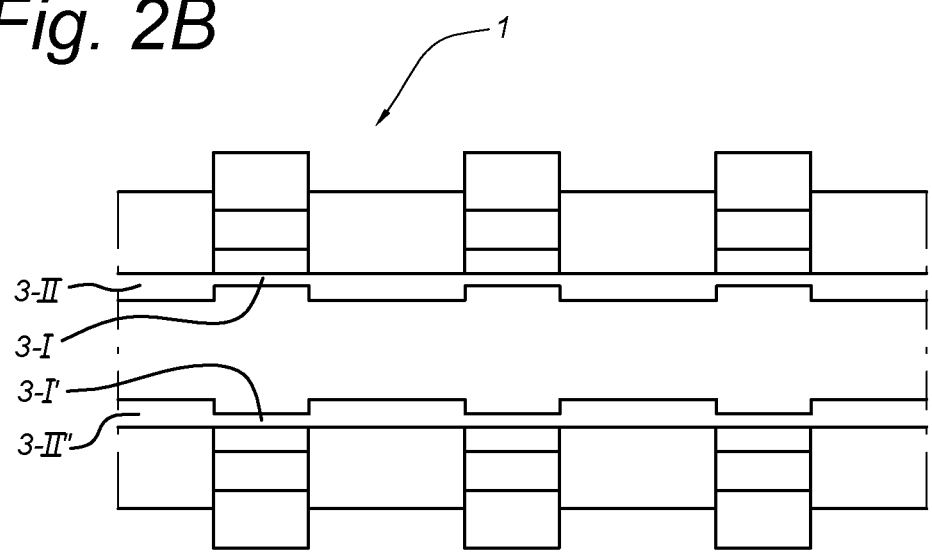

The present invention will be discussed in more detail below, with reference to the attached drawings, in which FIGS. 1A and 1B show cross sectional views of a photovoltaic cell wherein a first, respectively a second, single sided embodiment of the present invention is implemented;

FIGS. 2A and 2B show cross sectional views of a photovoltaic cell wherein a first, respectively a second, two sided embodiment of the present invention is implemented; and FIG. 3A-3D show cross sectional views of a photovoltaic cell of the integrated back contact (IBC type) wherein different embodiments of the present invention are implemented.

DESCRIPTION OF EMBODIMENTS

Photovoltaic cells with a doped polysilicon passivating carrier-selective contact on at least one side are known to have improved performance due to the excellent surface passivating properties of the doped polysilicon layer, if that polysilicon layer is combined with a thin dielectric passivating yet transmissive layer between the polysilicon and the wafer. For many applications, use of polysilicon on the rear side but not on the front side is preferred, because polysilicon on the front side results in some (often significant) optical losses.

Therefore, for the application of a polysilicon passivating contact on the front side of a solar cell it would be desired to provide polysilicon only in a close vicinity of the metallization, more precisely: at least between the metallization and the substrate (wafer). This would have a benefit of a local passivating contact where necessary, thus excellent passivation below the metal, and no (additional, or excessive) optical losses elsewhere, where a typical diffused emitter or front surface field would be present with much more limited optical losses than the polysilicon. The same features can be applied to the rear side if the bifacial solar cells are considered.

According to the present invention embodiments, a semiconductor (e.g. silicon) substrate 1 is provided to obtain an effective photovoltaic cell, e.g. according to the embodiment shown in FIG. 1A. The semiconductor substrate 1 has an active region 2, and a first surface and a second surface facing each other, and comprises a first type of passivating layer 5 (e.g. a polysilicon region) for providing an electrical contact of a first conductivity type on a part of the first surface of the semiconductor substrate 1 (e.g. to an electrode 6 as shown in the embodiment of FIG. 1A). The part is small in order to leave as much as possible area for receiving radiation. A thin dielectric layer 4 (e.g. a silicon oxide layer) is provided (locally) between the first type of passivating layer 5 and an active region 2 of the semiconductor substrate 1. The passivating layer 5 is arranged to provide an electrical contact of the first conductivity type, e.g. using a dopant, or more generally, a suitable band structure to obtain the contact of the first conductivity type. A dopant of the first conductivity type is provided in a layer 3 of the active region 2 of the semiconductor substrate 1 near the first surface, (vertically) aligned with the first type of passivating layer 5. Such diffusion underneath the electrode related area will improve lateral conductivity for electron/hole transport locally, improve the series resistance, in all further improving the efficiency of a resulting photovoltaic cell.

It is noted that the term passivating layer 5 is to be understood in a broad sense, and the exact implementation may be dependent on the type of (semiconductor) substrate 1 being used, or the type of resulting photovoltaic cell to be eventually obtained. As mentioned, the passivating layer 5 may be a polysilicon (polySi) region (in the case of a silicon substrate), but alternatively may comprise polysilicon with other impurities (like carbon), a doped organic semiconductor, or metal oxide with suitable band structure to provide passivation and selective carrier extraction. The transparency of the material of the passivating layer 5 is not very relevant, as it is covered eventually by the electrode 6, or at least covered eventually for a significant part by the electrode 6. Similarly, the dielectric layer 4 may be implemented as a silicon oxide layer (in case of a silicon substrate 1) but may also be implemented as a silicon nitride or an oxynitride layer.

In order to obtain an efficient photovoltaic cell, the first passivating layer 5 comprises a grid pattern distributed over the first surface, to allow a first (front) surface electrode pattern (e.g. in the form of 'polySi finger stacks' also written herein as 'poly finger stacks'), and to block as little radiation as possible in order to allow as much radiation as possible to reach the active layer 2.

In an exemplary embodiment, the lateral dopant level in the layer 3 of the active region 2 near the first surface is substantially uniform. In all embodiments, the layer 3 is present underneath the corresponding first passivating layer 5 (i.e. a minimum level of dopant is present everywhere) in order to enhance the lateral conductivity locally.

In FIGS. 1A and 1B two embodiments are shown, wherein the poly finger contacts according to the present invention are provided on a single side of the active region 2 of the semiconductor substrate 1.

FIG. 1A shows an embodiment wherein the active region 2 of the substrate 1 is provided with electrodes 6 (of a first conductivity type) on the top side, and electrodes 10 (of a second conductivity type) on the bottom side. The electrodes 6 on the top side are provided on locally arranged connecting structures including a passivating layer formed by a thin dielectric layer or dielectric layer 4 and a first type of (first conductivity type doped) polysilicon layer 5. In between the electrodes 6, the regular coating layer 7 (e.g. having antireflection properties) for a light receiving side of the substrate 1 is provided. In this embodiment, a dopant of a first conductivity type is provided in the first type of passivating layer 5 and in a layer 3 of the active region 2 of the semiconductor substrate 1 near the first surface.

It is noted that the invention embodiments can be seen as a 'polySi finger' arrangement associated with electrodes 6 of a photovoltaic cell. The layer 3 having the similar type of conductivity doping as the associated passivating layer 5, extends laterally beneath and away from the poly finger stack 4-6. In the case of similar polySi finger stacks on one side of the semiconductor substrate 1, this may then result in a single uniform layer 3 extending along the entire surface of the first side of the semiconductor substrate 1 (as shown in the embodiment of FIG. 1A). However, further alternatives exist as will be explained further below.

On the other side of the substrate 1 a second type of passivating layer 9 is present for providing an electrical contact of a second conductivity type (opposite to the first conductivity type) on the second surface of the semiconductor substrate 1. A (thin) dielectric layer 8 is provided between the second type of passivating layer 9 and the active region 2 of the semiconductor substrate 1. The dielectric layer 8 and second type of polysilicon layer 9 are provided as uniform layers spanning the entire active region 2, whereas the electrical contacts 10 may be provided as conductive strips or patterns. Also indicated is the back coating layer 11 on the back side of the substrate 1.

In general, the structure on the second side of the substrate 1 can be varied, and could be a traditionally diffused structure, or alternatively a passivated emitter rear cell (PERC) or other type of passivating contact structure.

It is noted that the dopant of a first conductivity type (in the first type of passivating layer 5) is e.g. n-type or p-type, and the second type of passivating layer 9 would then be the opposite conductivity type.

FIG. 1B shows an embodiment very similar to the embodiment of FIG. 1A, however, in this embodiment the thickness of the (doped) layer 3 in the active region 2 varies over its major surface. The layer 3 is divided in first areas 3-I vertically corresponding to (i.e. aligned with) the electrodes 6) and second areas 3-II vertically corresponding to the area between the electrodes 6. A thickness and/or integrated dopant concentration (per unit area) of the layer 3 of the active region 2 near the first surface is smaller in first areas 3-I of the layer vertically corresponding to the first type of passivating layer 5 than in second areas 3-II of the layer vertically corresponding to areas between the first type of passivating layer (5). In other words, the layer 3 has a generally uniform character (same type of dopant), but the (adjacent) first and second areas 3-I, 3-II may be implemented with different characteristics, i.e. thickness and/or (integrated) dopant concentration (per unit area). In this embodiment, the advantages of improved efficiency using a passivating stack (dielectric layer 4 and polysilicon layer 5) directly beneath a (non-transparent) electrode 6, is maintained, similar to the FIG. 1A embodiment.

It is noted that a dopant of the first conductivity type may further be present in the dielectric layer 4. It was found that this has no negative effect on the efficiency as obtained by the present invention embodiments.

For all embodiments as described herein, including those described with reference to the drawing embodiments, some further features may be included. E.g. the (silicon) dielectric layer 4 may have a thickness between 0.1 nm and 3 nm, in order to provide a proper tunneling function. The first type of passivating layer 5 may be in contact with an associated electrode 6 of a conductive material, such as Ag, or a transparent conductive oxide (TCO) material. The same may apply for the second type of passivating layer 9 and its associated electrode 10. If Ag is used, the associated electrodes 6, 10 may be obtained using a fire through process, initially using a paste with Ag particles, e.g. using screen or inkjet printing.

In FIGS. 2A and 2B two embodiments are shown, wherein the poly finger contact structures according to the present invention are provided on both sides of the active region 2 of the semiconductor substrate 1. As compared to the one sided embodiments of FIG. 1A, the embodiment of FIG. 2A further comprises a second type of passivating layer 5' for providing an electrical contact on a part of the second surface of the semiconductor substrate 1, wherein a (thin) dielectric layer 4' is provided locally between the second type of passivating layer 5' and the active region 2 of the semiconductor substrate 1, The structures on both sides of the substrate 1 are similarly shaped, but of opposite dopant type, i.e. extracting charge carriers of opposite type. Doping to a second conductivity type is provided in a layer 3' of the active region 2 of the semiconductor substrate 1 near the second surface (vertically) aligned with the second type of passivating layer 5'. A dopant of a second conductivity type is e.g. also provided in the second type of passivating layer 5', or in a further embodiment the second type of passivating layer 5' comprises second conductivity type doped polysilicon. This would e.g. allow the benefits as discussed above also to be applicable to bi-facial photovoltaic cells.

Similar variants as discussed with reference to the embodiments of FIGS. 1A and 1B above may also be applied for the double sided embodiments of FIGS. 2A and 2B. E.g. the second passivating layer 5' comprises a grid pattern distributed over the second surface of the substrate 1, to allow a back surface electrode 6' pattern.

Also, the lateral dopant level in the layer 3' of the active region 2 near the second surface may be substantially uniform in a further embodiment.

A surprising effect of the present invention embodiments, is that it was shown that widening the passivating layer 5, opposed to the as such known selective emitter technology, does not harm the open circuit voltage Voc of a resulting photovoltaic cell. As a result the passivating layer 5 may be wider than the electrode 6 to which it is connected, without deteriorating Voc. For selectively diffused patterns it is known that significant harm is caused in Voc the wider they are. As a result, also alignment tolerance requirements may be more relaxed in the case of the present invention embodiments, which is important for industrial application. Depending on further contact resistance between poly finger and semiconductor substrate, one may therefore want to use passivating layers 5 that are wider than the metal contact electrodes 6 by an amount more than necessary for simply alignment tolerance of the electrodes to the poly fingers, e.g. up to 50% or even up to 100% wider.

Furthermore, it is possible for the passivating layer 5 associated with one electrode 6 to extend laterally with a smaller thickness to an adjacent electrode 6, i.e. the passivating layer 5 may extend in a thin layer between the 'fingers' (stacks of passivating layer 5 and dielectric layer 4 in contact with the electrode 6).

In the embodiment shown in FIG. 2B, similar to the embodiment of FIG. 1B, the (doped) layer 3' in the active region 2 varies over its major surface. The layer 3' is divided in first areas 3-I' vertically corresponding to (i.e. aligned with) the electrodes 6' and second areas 3-II' vertically corresponding to the area between the electrodes 6'. A thickness of the layer 3' of the active region 2 near the second surface is smaller in first areas 3-I' of the layer 3' vertically corresponding to the second type of passivating layer 5' than in second areas 3-II' of the layer vertically corresponding to areas between the second type of passivating layer 5'.

It is noted that also in the embodiments as shown in FIGS. 2A and 2B, a dopant of the second conductivity type may be further present in the dielectric layer 4' adjacent to the second type of passivating layer 5'.

In FIG. 3A-D embodiments are shown of an interdigitated back contact type of a photovoltaic cell, wherein one or both of the back side contacts 6a, 6b are in the form of the poly finger contact structures according to the present invention, i.e. similar to the embodiments described above.

In an interdigitated back contact (IBC) embodiment of a photovoltaic cell, all electrical contacts are provided on a back side of the photovoltaic cell 1. Similar to the embodiments described above, an active region 2 is part of the substrate 1, and on the top (radiation receiving) side, a (buried or diffused) emitter layer 12 can be provided, covered with a further protective or passivating layer 13 (e.g. an anti-reflection layer). I.e. a diffused emitter layer 12 is provided in the active region 2 near the second surface. This allows all radiation to reach the active layer 2. On the bottom side, electrodes 6a, 6b of different polarity are positioned in an alternating fashion, forming an (interdigitated) backside electrode pattern. Further variants of an IBC type of photovoltaic cell are also possible with an implementation of the present invention embodiments at the back side, e.g. IBC cells with a front surface field, with a front dielectric passivation layer only, with a doped polySi front floating emitter (e.g. for tandem application), etc.

Figure 3A:
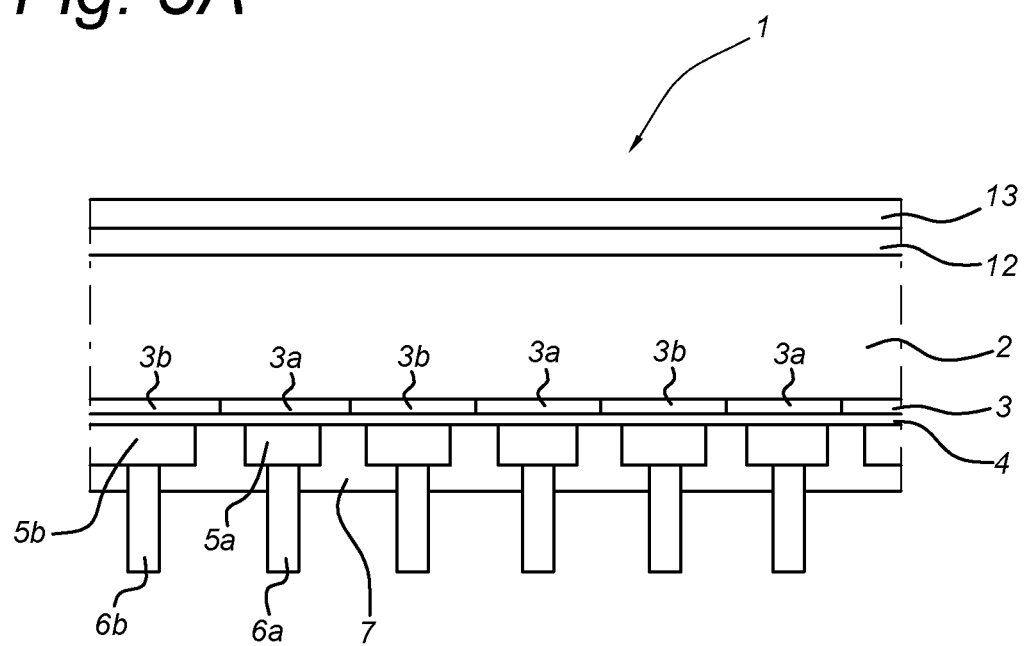

In the embodiment shown in FIG. 3A, dopants of a first and second conductivity type are provided in patterned layers 3a, 3b, respectively, of the active region 2 of the semiconductor substrate 1 near the back side. Layers 3a and 3b have the same conductivity type as layers 5a, 5b, respectively. In this embodiment, a (thin) dielectric layer 4 is provided (e.g. a silicon oxide layer), also a uniform layer spanning the entire back side of substrate 1, or at least between layers 5a and 5b and the semiconductor substrate 1.

In generic terms for the IBC embodiments according to the present invention the semiconductor substrate further comprises a second type of passivating layer 5b for providing an electrical contact of a second conductivity type, opposite to the first conductivity type, on the first side of the semiconductor substrate 1, wherein a (thin) dielectric layer 4 is also provided between the second type of passivating layer 5b and the active region 2 of the semiconductor substrate 1, wherein doping of the second conductivity type is provided in a layer 3b of the active region 2 of the semiconductor substrate 1 near the first surface, (vertically) aligned with the second type of passivating layer (5b). Note that in these IBC embodiments, the first surface is a back side of the IBC photovoltaic cell and the second surface of the semiconductor substrate 1 is the radiation receiving side.

Similar to the earlier described embodiments, in the IBC embodiments, the layers 3a, 3b extend laterally beneath and away from the associated passivating layers 5a, 5b, having the respective similar type of conductivity. Further alternative embodiments exist as will be explained further below.

In one embodiment, a dopant of a second conductivity type is provided in the second type of passivating layer 5b. E.g., the second type of passivating layer 5b comprises second conductivity type doped polysilicon.

In the embodiment as shown in the cross sectional view of FIG. 3A, the layer 3 of the active region 2 of the semiconductor substrate 1 near the first surface is provided as adjacent fields 3a, 3b of opposing polarity (i.e. different type of doping), aligned with the first type of passivating layer 5a and the second type of passivating layer 5b, respectively.

Figure 3B:
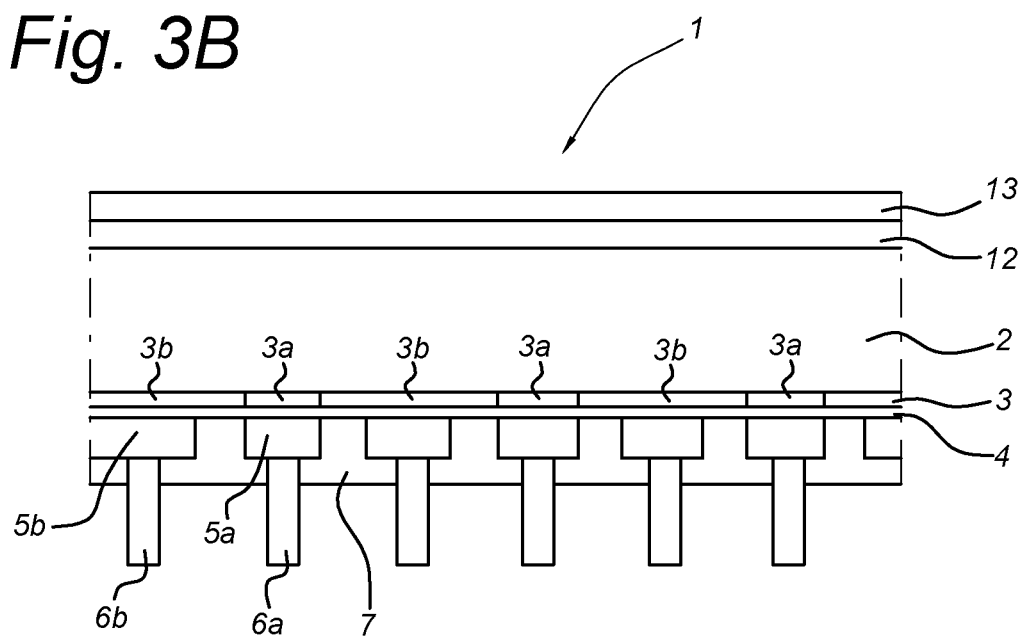

Further variants are possible specifically for IBC type of photovoltaic cells. In the embodiment as shown in FIG. 3B, the adjacent fields 3a, 3b of opposing polarity have different widths. This would e.g. allow to fine tune the characteristics of both types of poly finger stacks (3a, 4a, 5a, 6a; 3b, 4b, 5b, 6b) by variation of the width of the adjacent fields 3a, 3b only.

An even further alternative embodiment is shown in the cross sectional view of FIG. 3C, wherein the adjacent fields 3a, 3b are mutually separated. I.e. the active region 2 extends between the adjacent fields 3a, 3b of opposing polarity.

Furthermore, the poly finger stack according to the present invention embodiment, may be applied only to a single polarity electrode. As shown in the embodiment of FIG. 3D, the layer 3 of the active region 2 of the semiconductor substrate 1 near the first surface is provided as fields 3a aligned with the first type of passivating layer 5a only.

For the IBC embodiments as shown in FIG. 3A-D, the passivating layers 5a, 5b may be provided as patterns of (doped) polysilicon. A protective layer 7 is indicated as being provided in between the opposing polarity electrode/polysilicon stack 5a/6a, 5b/6b.

The embodiments as described herein can be manufactured economically with readily available and as such known, processing steps. One low-cost process for polysilicon deposition is LPCVD. LPCVD polysilicon can typically be deposited on both sides of the substrate 1. The pattering of polysilicon may be considered straightforward and can e.g. be done similarly as in an etched-back selective emitter approach (applying a resist in the vicinity of the metallization area followed by wet-chemical removal). Thus, the invention embodiments can be applied to both sides of a substrate 1. Alternatively the invention embodiments can be applied only to the front side, and a full-area polysilicon passivating back contact to the rear, where optical losses are less important, or only to the back side (see e.g. the embodiments of FIG. 3A-D). The lean process is enabled by the fact that the patterned polysilicon areas and conventional diffused areas can be doped in one doping step (diffusion or implantation) providing the invention to be industrially attractive. Furthermore, both sides can be provided with local polysilicon adjacent to a diffused area in only two doping steps (e.g. one doping step for P-implantation at the rear and a second step for BBr3 diffusion or B-implantation).

A method to create one of the embodiments as described above, may be obtained by (not necessarily in sequence, unless where explicitly noted)

on the first (front) side: providing an intrinsic polysilicon layer (which may be patterned as in a selective emitter approach), which is subsequently exposed to BBr3 diffusion, thus creating the p-type polysilicon passivating layer (first type of passivating layer 5) adjacent to a B-diffused emitter (layer 3 in the active region 2);

on the second (rear) side: providing a BBr3 diffusion barrier on the rear. An n-type passivating layer 5' at the second side (rear side), either blanket or etched back or local under the fingers) is provided with a BBr3 diffusion barrier that prevents B to reside with P in the n-type polysilicon lowering effective mobility and adversely affecting Rsheet.

Alternatively, a BBr3 diffusion barrier may be provided on the rear which wraps around slightly to a front side of the substrate 1 enabling (passivated) edge isolation.

A further embodiment would be to effectuate an implant of dopant on the second (rear) side with an aperture mask, shielding the edge of the substrate 1 during implant. An even further embodiment would be to execute a BBr3 diffusion step activating n-type polysilicon.

In an even further embodiment, which is really efficient in lowering the number of processing steps, a printable diffusion barrier is used as well as a printable B dopant source, e.g. in the form of a paste. During the P diffusion step, also B diffusion will take place from the B dopant source.

The present invention has been described above with reference to a number of exemplary embodiments as shown in the drawings. Modifications and alternative implementations of some parts or elements are possible, and are included in the scope of protection as defined in the appended claims.

The invention claimed is:

1. A semiconductor substrate having an active region and a first surface and a second surface facing each other, comprising a first type of passivating layer for providing an electrical contact of a first conductivity type only on a part of the first surface of the semiconductor substrate,
   wherein a dielectric layer is provided between the first type of passivating layer and the active region of the semiconductor substrate, and
   wherein doping of the first conductivity type is provided in a layer of the active region of the semiconductor substrate near the first surface, aligned with the first type of passivating layer, and wherein a lateral dopant level in the layer of the active region near the first surface has a generally uniform character,
   wherein a thickness and/or integrated dopant concentration per unit area of the layer of the active region near the first surface is smaller in first areas of the layer vertically corresponding to the first type of passivating layer than in second areas of the layer vertically corresponding to areas between the first type of passivating layer.

2. The semiconductor substrate according to claim 1, wherein the first type of passivating layer comprises a grid pattern distributed over the first surface.

3. The semiconductor substrate according to claim 1, wherein a dopant of the first conductivity type is further present in the dielectric layer.

4. The semiconductor substrate according to claim 1, further comprising a second type of passivating layer for providing an electrical contact of a second conductivity type, opposite to the first conductivity type, on the second surface of the semiconductor substrate,
   wherein a dielectric layer is provided between the second type of passivating layer and the active region of the semiconductor substrate.

5. The semiconductor substrate according to claim 1, further comprising a second type of passivating layer for providing an electrical contact of a second conductivity type, opposite to the first conductivity type, on a part of the second surface of the semiconductor substrate,
   wherein a dielectric layer is provided between the second type of passivating layer and the active region of the semiconductor substrate, and
   wherein doping of the second conductivity type is provided in a layer of the active region of the semiconductor substrate near the second surface, aligned with the second type of passivating layer.

6. The semiconductor substrate according to claim 5, wherein the second type of passivating layer comprises a grid pattern distributed over the second surface.

7. The semiconductor substrate according to claim 5, wherein a lateral dopant level in the layer of the active region near the second surface has a generally uniform character.

8. The semiconductor substrate according to claim 5, wherein a thickness or integrated dopant concentration per unit area of the layer of the active region near the second surface is smaller in first areas of the layer vertically corresponding to the second type of passivating layer than in second areas of the layer vertically corresponding to areas between the second type of passivating layer.

9. The semiconductor substrate according to claim 5, wherein a dopant of the second conductivity type is further present in the dielectric layer adjacent to the second type of passivating layer.

* * * * *